(12) United States Patent
Poplavskyy et al.

(10) Patent No.: US 8,361,834 B2
(45) Date of Patent: Jan. 29, 2013

(54) METHODS OF FORMING A LOW RESISTANCE SILICON-METAL CONTACT

(75) Inventors: Dmitry Poplavskyy, San Jose, CA (US); Malcolm Abbott, San Jose, CA (US)

(73) Assignee: Innovalight, Inc., Sunnyvale, CA (US)

( * ) Notice: Subject to any disclaimer, the term of this patent is extended or adjusted under 35 U.S.C. 154(b) by 339 days.

(21) Appl. No.: 12/714,941

(22) Filed: Mar. 1, 2010

(65) Prior Publication Data

US 2010/0221903 A1      Sep. 2, 2010

Related U.S. Application Data

(63) Continuation-in-part of application No. 12/050,635, filed on Mar. 18, 2008, now Pat. No. 7,704,866.

(51) Int. Cl.
| | |
|---|---|
| H01L 21/00 | (2006.01) |
| H01L 21/265 | (2006.01) |
| H01L 29/10 | (2006.01) |
| H01L 29/40 | (2006.01) |

(52) U.S. Cl. ............ 438/98; 438/523; 257/44; 257/436; 257/437

(58) Field of Classification Search ............. 438/98, 438/523; 257/44, 184, 436, 437, 618–621
See application file for complete search history.

(56) References Cited

U.S. PATENT DOCUMENTS

| | | | |
|---|---|---|---|
| 4,219,448 | A | 8/1980 | Ross |
| 5,720,827 | A | 2/1998 | Simmons |
| 5,766,971 | A | 6/1998 | Ahlgren et al. |
| 6,239,355 | B1 | 5/2001 | Salafsky |
| 6,277,766 | B1 | 8/2001 | Ayers |
| 6,358,613 | B1 | 3/2002 | Buriak |
| 6,485,986 | B1 | 11/2002 | Buriak et al. |
| 6,569,979 | B1 | 5/2003 | Strother et al. |
| 6,677,163 | B1 | 1/2004 | Boukherroub et al. |
| 6,710,366 | B1 | 3/2004 | Lee et al. |

(Continued)

FOREIGN PATENT DOCUMENTS

| | | |
|---|---|---|
| DE | 103 26 538 A1 | 1/2005 |
| EP | 1 713 091 B1 | 9/2010 |

(Continued)

OTHER PUBLICATIONS

International Search Report and Written Opinion dated Sep. 22, 2010, 12 pages.

(Continued)

*Primary Examiner* — Fernando L Toledo
*Assistant Examiner* — Karen Kusumakar
(74) *Attorney, Agent, or Firm* — Foley & Lardner LLP

(57) ABSTRACT

A method of forming an ohmic contact on a substrate is described. The method includes depositing a set of silicon particles on the substrate surface. The method also includes heating the substrate in a baking ambient to a baking temperature and for a baking time period in order to create a densified film ink pattern. The method further includes exposing the substrate to a dopant source in a diffusion furnace with a deposition ambient, the deposition ambient comprising $POCl_3$, a carrier $N_2$ gas, a main $N_2$ gas, and a reactive $O_2$ gas at a deposition temperature and for a deposition time period, wherein a PSG layer is formed on the substrate surface. The method also includes heating the substrate in a drive-in ambient to a drive-in temperature and for a drive-in time period; and depositing a silicon nitride layer. The method further includes depositing a set of metal contacts on the set of silicon particles; and heating the substrate to a firing temperature and for a firing time period.

24 Claims, 11 Drawing Sheets

U.S. PATENT DOCUMENTS

| | | | |
|---|---|---|---|
| 6,846,681 | B2 | 1/2005 | Buriak et al. |
| 6,869,864 | B2 | 3/2005 | Yim et al. |
| 6,878,871 | B2 | 4/2005 | Scher et al. |
| 6,897,471 | B1 | 5/2005 | Soref et al. |
| 6,943,054 | B2 | 9/2005 | Bocian et al. |
| 6,986,818 | B2 | 1/2006 | Tillotson et al. |
| 7,135,350 | B1* | 11/2006 | Smith et al. ............... 438/48 |
| 7,309,650 | B1 | 12/2007 | Wang et al. |
| 7,443,027 | B2* | 10/2008 | Wu et al. ............... 257/734 |
| 7,615,393 | B1 | 11/2009 | Shah et al. |
| 2001/0024766 | A1* | 9/2001 | Kita et al. ............... 430/272.1 |
| 2003/0231237 | A1* | 12/2003 | Nagaike et al. ............... 347/105 |
| 2004/0095658 | A1 | 5/2004 | Buretea et al. |
| 2004/0229447 | A1 | 11/2004 | Swihart et al. |
| 2004/0266148 | A1 | 12/2004 | Yim et al. |
| 2005/0008880 | A1 | 1/2005 | Kunze et al. |
| 2005/0107478 | A1 | 5/2005 | Klimov et al. |
| 2005/0126628 | A1 | 6/2005 | Scher et al. |
| 2005/0150541 | A1 | 7/2005 | Scher et al. |
| 2005/0183766 | A1 | 8/2005 | Nakajima et al. |
| 2005/0214967 | A1 | 9/2005 | Scher et al. |
| 2006/0060862 | A1 | 3/2006 | Bawendi et al. |
| 2006/0163744 | A1* | 7/2006 | Vanheusden et al. ........ 257/773 |
| 2006/0231802 | A1 | 10/2006 | Konno |
| 2007/0006914 | A1 | 1/2007 | Lee |
| 2008/0160265 | A1 | 7/2008 | Hieslmair et al. |
| 2008/0160733 | A1* | 7/2008 | Hieslmair et al. ............ 438/558 |
| 2008/0202576 | A1* | 8/2008 | Hieslmair ............ 136/244 |
| 2009/0243111 | A1 | 10/2009 | Ishikawa et al. |
| 2010/0000598 | A1* | 1/2010 | Lorenzetti et al. ............ 136/255 |

FOREIGN PATENT DOCUMENTS

| | | |
|---|---|---|
| JP | 2004-071716 | 3/2004 |
| JP | 2005-217046 | 8/2005 |
| JP | 2005-332913 | 12/2005 |
| WO | WO 99/21934 | 5/1999 |
| WO | WO 2004/023527 | 3/2004 |
| WO | WO 2004/068536 | 8/2004 |
| WO | WO 2004/093202 | 10/2004 |
| WO | WO 2005/075048 | 8/2005 |
| WO | WO 2006/034025 | 3/2006 |
| WO | WO 2006/063893 | 6/2006 |
| WO | WO 2007/076424 A1 | 7/2007 |
| WO | WO 2008/026415 A1 | 3/2008 |

OTHER PUBLICATIONS

"DuPont Photovoltaic Solutions," *Product Information Sheet K*-15733, pp. 1-2, Aug. 2006.

Preston et al., "Solar Energy Research at the Department of Energy. Big Deal!", Oct. 19, 2005.

S. L. Dexheimer and K. G. Lynn, "Novel Characterization Methods for Microcrystalline Silicon", *Subcontractor Report*, National Renewable Energy Laboratory, NREL/SR-520-34949, Oct. 2003.

L. Sawires, "A new advanced microwave technology promises to increase the speed and energy efficiency of annealing, coating and joining everything from glass and ceramics to semiconductors", Nov. 1, 2002, available at http://www.ceramicindustry.com/, last visited Jun. 3, 2008.

R. E. I. Schropp, "Thin Film Silicon PV: Research and Implementation (PowerPoint)", *Zonneceldag* 2003, Utrecht University, Debye Institute, Physics of Devices, Sep. 30, 2003.

Garcia-Serrano, J. et al., "Formation and vibrational structure of Si nano-clusters in ZnO matrix," *Revista Mexicana De Fisica*, 47(1), Feb. 2001, pp. 26-29.

Ray, S. K. et al., "Luminescence characteristics of Ge nanocrystals embedded in $SiO_2$ matrix," *Optical Materials*, Feb. 27, 2005, pp. 948-952; published by Elsevier B.V.

Ando, M. et al., "Transient photocurrent of (silicon nanocrystals)-(organic polysilane) composites—detection of surface states of silicon nanocrystals," *Thin Solid Films*, 499 (1-2), Mar. 2006, pp. 119-122; published by Elsevier B.V.

Martucci, A. et al., "Microstructural and nonlinear optical properties of silica-titania sol-gel film doped with PbS quantum dots," *J. Applied Physics*, 86 (1), Jul. 1999, pp. 79-87; published by American Institute of Physics.

Guglielmi, M. et al., "Control of Semiconductor Particle Size in Sol-Gel Thin Films," *Journal of Sol-Gel Sciences and Technology*, 8, 1997, pp. 1017-1021; published by Kluwer Academic Publishers, The Netherlands.

Buriak, J. M., "Organometallic chemistry on Silicon and Germanium Surfaces," *Chemical Reviews*, 102 (5) (May 2002), pp. 1271-1308; published by American Chemical Society.

Lau, H. W. et al., "Defect-induced photoluminescence from tetraethylorthosilicate thin films containing mechanically milled silicon nanocrystals," *J. Applied Physics*, 97 (10) (May 2005), pp. 104307-1-104307-4; published by American Institute of Physics.

Dias, M. L. et al., "Core shell silica-silicon hybrid nanoparticles: synthesis and characterization," *J. Metastable and Nanocrystalline Materials*, 22 (2004), pp. 83-90; published by Trans Tech Publications, Switzerland.

International Search Report for PCT/US2007/067126, mailed Dec. 5, 2007.

International Search Report for PCT/US2007/073037, mailed Nov. 15, 2007.

Dang, Y. X. et al., "Study of the Interdiffusion Effect on the Band Structures of $Si_{1-x}Ge_x/Si$ Quantum Wells," *Journal of Applied Physics*, vol. 99, No. 7, Apr. 10, 2006, pp. 076108-1-076108-3; published by American Institute of Physics.

Lenhart, J. L. et al., "Characterization of sizing layers and buried polymer/sizing/substrate interfacial regions using a localized fluorescent probe," *Journal of Colloid and Interface Science*, vol. 257 (2003), pp. 398-407; published by Elsevier Science (USA).

Li-Wei Tu et al., "Observation of quantum size effect in the resistivity of thin, gray tin epilayers", *Appl. Phys. Lett.*, vol. 55, No. 13, Sep. 25, 1989, pp. 1327-1329; published by American Institute of Physics.

Miesner, C. et al., "Intra-Valence Band Photocurrent Measurements on Ge Quantum Dots in Si," *Thin Solid Films*, vol. 380, No. 1-2, Dec. 22, 2000, pp. 180-182; published by Elsevier Science B.V.

Sarney, W. L. et al., "Microstructural Characterization of Quantum Dots with Type-II Band Alignments," *Solid-State Electronics*, vol. 50, No. 6, Jun. 2006, pp. 1124-1127; published by Elsevier Ltd.

Nozik, A. J., "Advanced Concepts for Photovoltaic Cells," Presented at the National Center for Photovoltaics and Solar Program Review Meeting: Denver, Colorado, Mar. 24-26, 2003, pp. 1-5.

Ellingson et al. "Highly Efficient Multiple Exciton Generation in Colloidal PbSe and PbS Quantum Dots," *Nano Letters*, vol. 5, No. 5, (2005) pp. 865-871; published by American Chemical Society.

Ellingson et al. "Nanocrystals Generating >1 Electron Per Photon May Lead to Increased Solar Cell Efficiency," Printed from website on Sep. 11, 2006: http://newsroom.spie.org/x3923.xml?ss=print.

Shang Yuan Ren, "Quantum Confinement in Semiconductor Ge Quantum Dots," *Solid State Communications*, vol. 102, No. 6 (1997) pp. 479-484; published by Elsevier Science Ltd.

Wenju Feng et al., "Self-Assembly and Characterization of Fullerene Monolayers on Si(100) Surfaces," *Langmuir American Chem. Soc. USA*, vol. 15, No. 9 (Apr. 27, 1999), pp. 3152-3156; published by American Chemical Society.

International Search Report for PCT/US2007/077007, mailed Mar. 17, 2008.

Chekalin, S. et al., "Ultrafast photoinduced processes in fullerene-metal nanostructures," *Proc. Spie. Int. Eng; Proceedings of Spie—The International Society for Optical Engineering; Photon Echo and Coherent Spectroscopy*, vol. 6181 (2005), Sep. 18, 2005, pp. 1-5.

Database WPI Week 200564, Derwent Publications Ltd., London, GB, reporting Abstract of JP2005-236278.

International Search Report for PCT/US2007/079393, mailed Sep. 25, 2008.

Ravirajan et al., "Hybrid nanocrystalline $TiO_2$ solar cells with a fluorine-thiophene copolymer as a sensitizer and hole conductor," Journal of Applied Physics, Feb. 2004, 95(3):1473-1480.

International Search Report and Written Opinion mailed Apr. 25, 2011, in corresponding PCT/US2011/26253, 9 pages.

* cited by examiner

METHODS OF FORMING A LOW RESISTANCE SILICON-METAL CONTACT

CROSS-REFERENCE TO RELATED APPLICATIONS

This application claims the benefit of U.S. Pat. No. 12/050,635 filed Mar. 18, 2008, entitled Methods for Forming Composite Nanoparticle-Metal Metallization Contacts on a Substrate, the entire disclosure of which is incorporated by reference.

FIELD OF DISCLOSURE

This disclosure relates in general to photovoltaic cells in particular to methods of forming a low resistance silicon-metal contact.

BACKGROUND

A solar cell converts solar energy directly to DC electric energy. Generally configured as a photodiode, a solar cell permits light to penetrate into the vicinity of metal contacts such that a generated charge carrier, such as an electron or a hole (a lack of an electron), may be extracted as current.

Most solar cells are generally formed on a silicon substrate doped with a first dopant (often boron) forming an absorber region, upon which a second counter dopant (often phosphorous), is diffused forming the emitter region, in order to complete the p-n junction. After the addition of passivation and antireflection coatings, metal contacts (fingers and busbar on the emitter and pads on the back of the absorber) may be added in order to extract generated charge.

In general, a low dopant atom concentration within an emitter region will beneficially result in low recombination (and thus higher solar cell efficiencies), but detrimentally result in poor electrical contact (high resistance) to metal electrodes. Conversely, a high dopant atom concentration will detrimentally result in high recombination, but beneficially result in low resistance ohmic contacts to metal electrodes. This is particularly true when the front metal electrode is formed using a screen printed silver paste. Often, in order to reduce manufacturing costs, a single uniform dopant diffusion is used to form an emitter. However, the doping concentration is generally a compromise between low recombination and a good metal contact. That is, low recombination can generally be achieved at lower doping, however higher doping is required for contact formation. Consequently, the resulting solar cell efficiency (the percentage of sunlight that is converted to electricity) is generally reduced as a result of such a compromise.

Referring now to FIG. 1, a simplified diagram of a traditional front-contact solar cell is shown. In a common configuration, an n-type diffused region 108 is first formed on a p-type (lightly doped) silicon substrate 110. Prior to the deposition of silicon nitride ($SiN_x$) layer 104 on the front of the substrate, residual PSG formed on the substrate surface during the phosphorous deposition process (i.e., $POCl_3$) is substantially removed, commonly by exposing the silicon substrate to hydrofluoric acid (HF). The set of metal contacts, comprising front-metal contact 102 and back surface field (BSF)/back metal contact 116, are then sequentially formed on and subsequently fired into silicon substrate 110.

The front metal contact 102 is commonly formed by depositing an Ag (silver) paste, comprising Ag powder (about 70 to about 80 wt % (weight percent)), lead borosilicate glass (frit) PbO—$B_2O_3$—$SiO_2$ (about 1 to about 10 wt %), and organic components (about 15 to about 30 wt %). After deposition the paste is dried at a low temperature to remove organic solvents and fired at high temperatures to form the conductive metal layer and to enable the silicon-metal contact. During the firing process, as the temperature is increased up to about 400° C., the frit softens and forms a molten glass which wets and dissolves the underlying anti-reflective coating (e.g., silicon nitride) barrier layer 106 layer in an exothermal redox reaction:

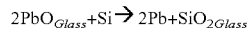
[Equation 1]

In view of the foregoing, there is a desire to provide method of forming a low resistance silicon metal contact on the low-doped emitters.

SUMMARY

The invention relates, in one embodiment, to a method of forming an ohmic contact on a substrate. The method includes depositing a set of silicon particles on the substrate surface. The method also includes heating the substrate in a baking ambient to a baking temperature and for a baking time period in order to create a densified film ink pattern. The method further includes exposing the substrate to a dopant source in a diffusion furnace with a deposition ambient, the deposition ambient comprising $POCl_3$, a carrier $N_2$ gas, a main $N_2$ gas, and a reactive $O_2$ gas at a deposition temperature and for a deposition time period, wherein a PSG layer is formed on the substrate surface. The method also includes heating the substrate in a drive-in ambient to a drive-in temperature and for a drive-in time period; and depositing a silicon nitride layer. The method further includes depositing a set of metal contacts on the set of silicon particles; and heating the substrate to a firing temperature and for a firing time period.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
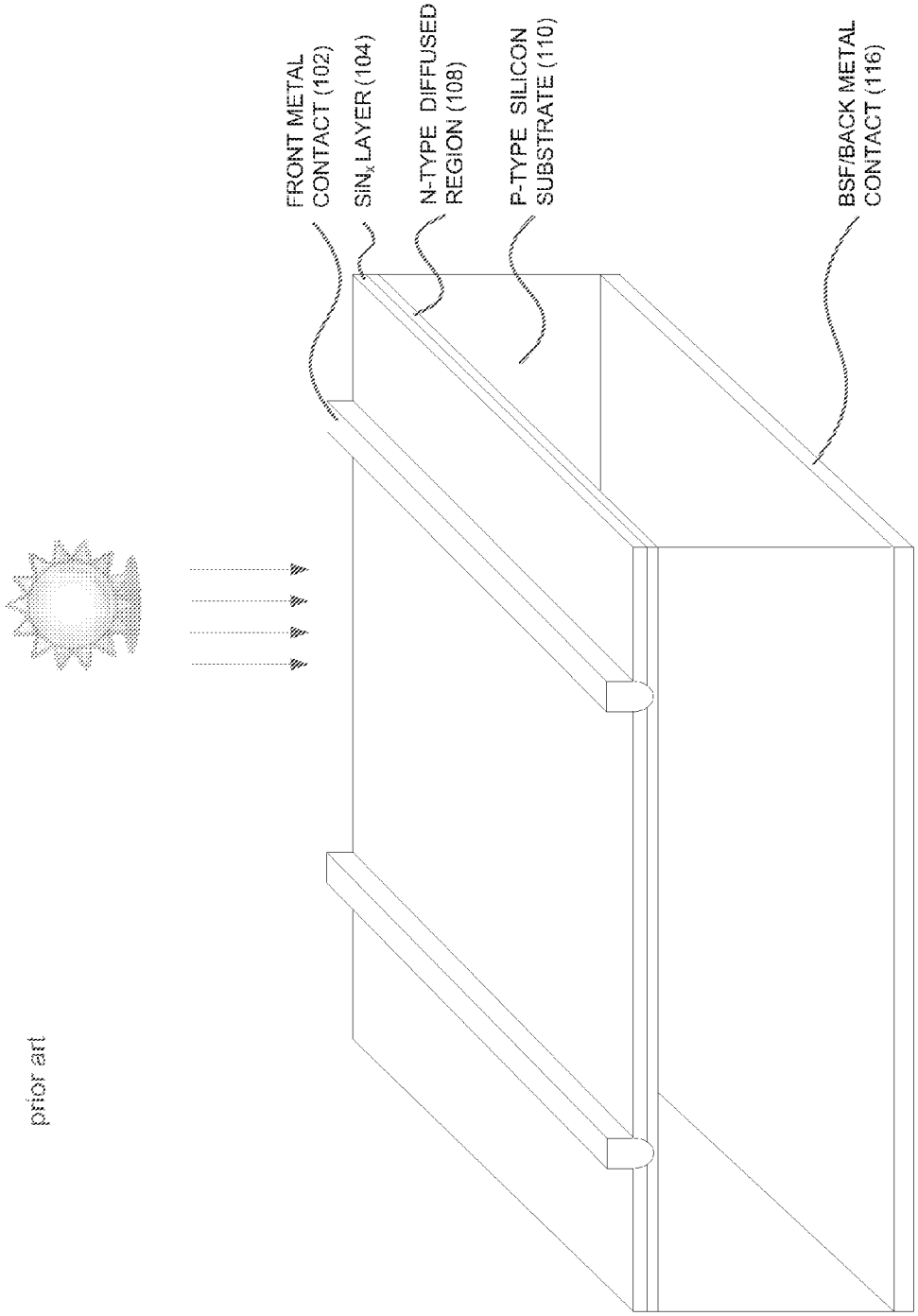
FIG. 1 shows a simplified diagram of a traditional front-contact solar cell.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In general, for crystalline solar cells made with screen printed metal contacts, a single dopant diffusion is often used to form the emitter region, with a resulting dopant concentration selected as a compromise between low charge carrier recombination and good silicon—metal connectivity. In particular it is necessary to have a high surface concentration of phosphorous to facilitate the formation of silver crystallites during the metal firing process. These crystallites form at the interface between the metal and silicon and are critical in achieving good contact resistance. See G. Schubert, J. Horzel, R. Kopecek, F. Huster, and P. Fath, "Silver thick film contact formation on lowly doped phosphorous emitters," in Proceedings of the 20th European Photovoltaic Solar Energy Conference (EU PVSEC '05), p. 934, Barcelona, Spain, June 2005.

In an advantageous manner, a phosphorus doped silicon particle film, formed on the substrate surface, may be used to catalyze the formation of silver crystallites between the metal and the silicon surface, thus enabling the formation of a low resistance ohmic contact. Using a particle film containing silicon and phosphorous to enhance the formation of crystallites allows the doping profile of the emitter to be optimized for low carrier recombination, resulting in improved conversion efficiency of the cell. The layer may be deposited before the diffusion step, after the diffusion step, after the phosphosilicate glass (PSG) removal and/or after the nitride step. For example, in one configuration, the phosphrous in the particle film is absorbed after deposition during a $POCL_3$ diffusion process. In other configurations, phosphorous may be present in the nanoparticle film immediately after printing.

The particles may be produced by a variety of techniques such as evaporation (S. Ijima, Jap. J Appl. Phys. 26, 357 (1987)), gas phase pyrolysis (K. A Littau, P. J. Szajowski, A. J. Muller, A. R. Kortan, L. E. Brus, J Phys. Chem. 97, 1224 (1993)), gas phase photolysis (J. M. Jasinski and F. K. LeGoues, Chem. Mater. 3, 989 (1991);), electrochemical etching (V. Petrova-Koch et al., Appl. Phys. Lett. 61, 943 (1992)), plasma decomposition of silanes and polysilanes (H. Takagi et al, Appl. Phys. Lett. 56, 2379 (1990)), high pressure liquid phase reduction-oxidation reaction (J. R. Heath, Science 258, 1131 (1992)), etc.

In addition, the particles may be doped using techniques as described by U.S. patent application Ser. No. 12/113,451, entitled Methods And Apparatus For The Production of Group IV Nanoparticles in a Flow-Through Plasma Reactor, and filed May 1, 2008, and U.S. patent application Ser. No. 11/842,466, entitled In Situ Doping of Group IV Semiconductor Nanoparticles and Thin Films Formed Therefrom, and filed Aug. 21, 2007, both incorporated by reference. The diameter of the silicon particles is preferable between about 2 nm and about 100 nm, more preferably between about 3 nm and about 50 nm, and most preferably between about 5 nm and about 20 nm.

One method of depositing the particles is with a colloidal dispersion. In general, a colloidal dispersio is a type of homogenous mixture consisting of two separate phases: a continuous phase (such as a solvent), and a dispersed phase (generally particles). The particles may be suspended in a silicon particle fluid (colloidal dispersion) that may include solvents (e.g., alcohols, aldehydes, ketones, carboxylic acids, esters, amines, organosiloxanes, halogenated hydrocarbons, other hydrocarbons, etc.) and particle capping groups (e.g., alcohols, aldehydes, ketones, carboxylic acids, esters, amines, organosiloxanes, etc.) These solvents and capping groups may be subsequently removed during the sintering process, or in a lower temperature pre-heat just before the sintering process. In addition, doping in the nanoparticle film may be achieved by incorporation of doped additives, such as e.g. phosphoric acid, in the dispersion containing undoped nanoparticles.

Figure 2A:
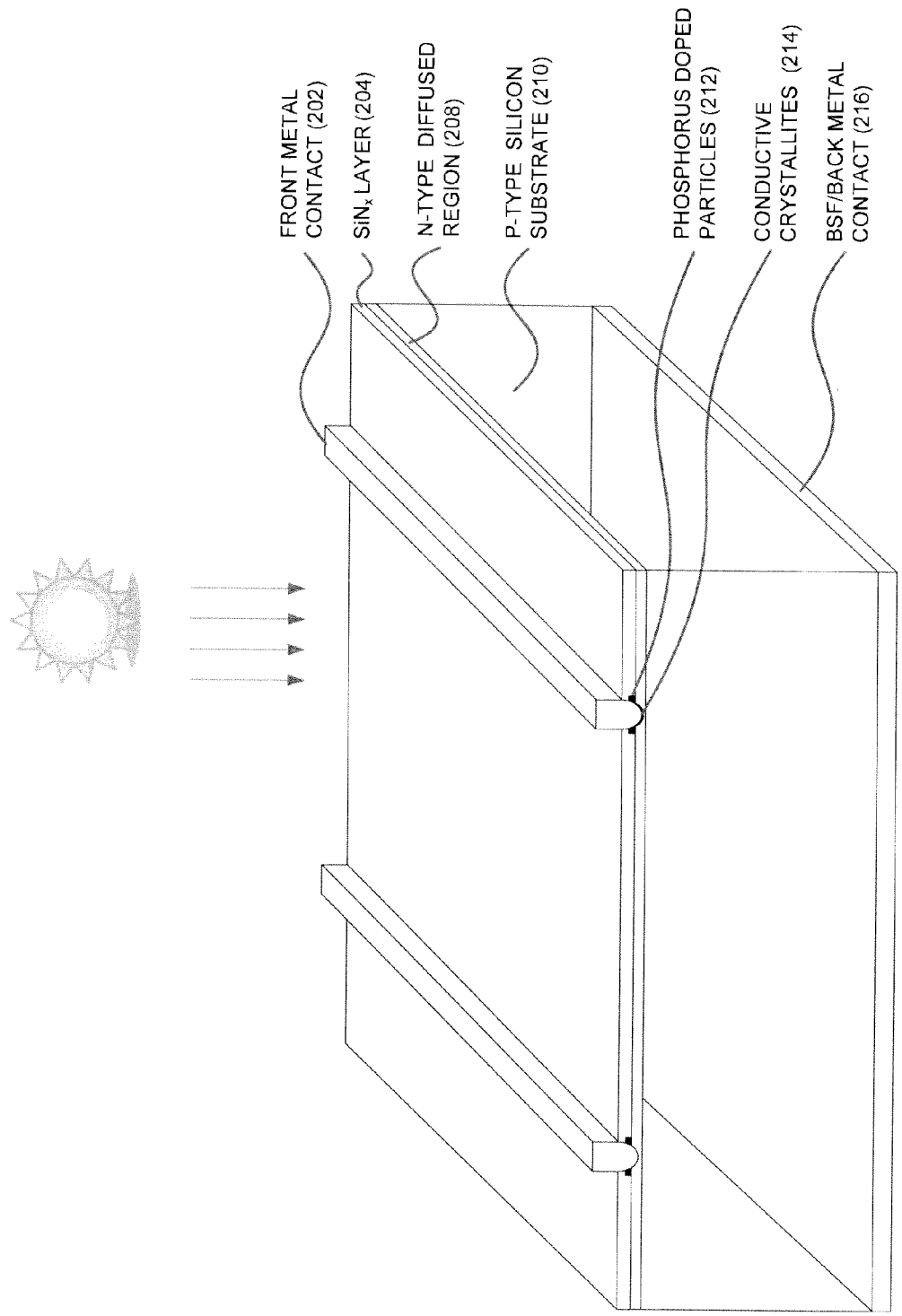
FIGS. 2A-C show a simplified set of diagrams of the front-metal contact solar cell after having been fired-through a phosphorus doped particle layer on a solar cell, in accordance with the invention.
Figure 2B:
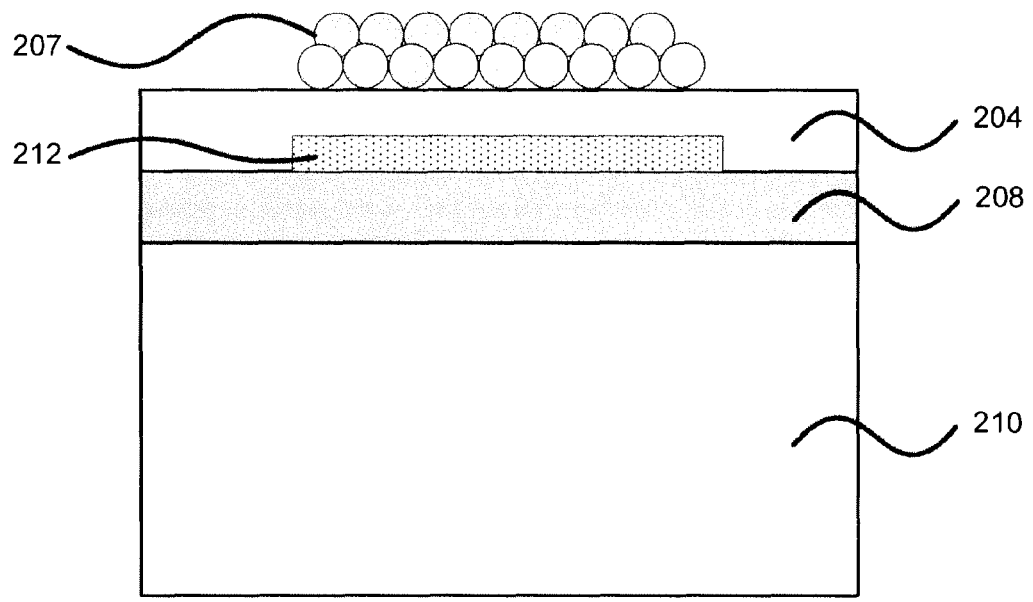
Figure 2C:
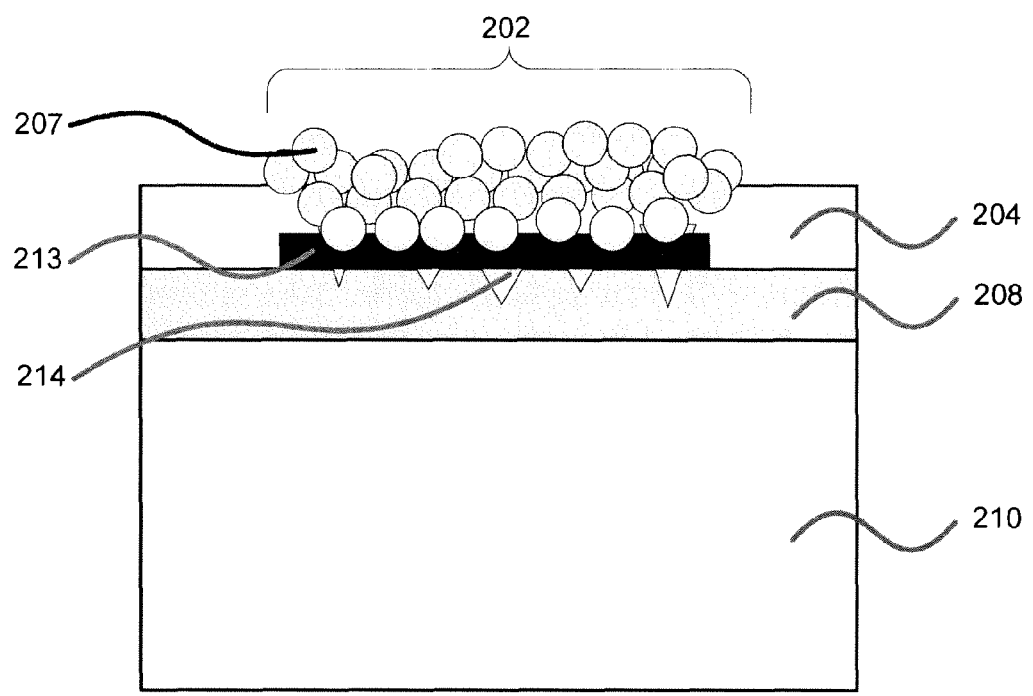

Referring now to FIGS. 2A-C, a simplified set of diagrams showing the front-metal contact solar cell after having been fired-through a phosphorus doped particle layer on a solar cell in accordance with the invention.

FIG. 2A shows a simplified diagram of a front-contact solar cell with a phosphorus doped silicon particle layer. In general, an n-type diffused region 208 is first formed on a p-type (lightly doped) silicon substrate 210. Prior to the deposition of silicon nitride ($SiN_x$) layer 204 on the front of the substrate, residual PSG formed on the substrate surface during the phosphorous deposition process (i.e., $POCl_3$) is substantially removed, commonly by exposing the silicon substrate to hydrofluoric acid (HF). The set of metal contacts, comprising front-metal contact 202 (commonly a Ag paste as previoiusly described) and back surface field (BSF)/back metal contact 216, are then sequentially formed on and subsequently fired into silicon substrate 210. The presence of the phosphrous containing silicon particle layer 212 enhances the formation of crystallites at the interface between the front metal contact metal and the silicon substrate.

Referring to FIG. 2B, a simplified schematic of the solar cell of FIG. 2A, prior to firing through the front-metal contact, in accordance with the invention. The layer of metal paste, containing silver particles 207, printed on the silicon nitride layer 204 over the deposited nanoparticle layer 212 is shown. As the temperature is increased during the firing process, the frit contained in the paste begins to etch through the silicon nitride layer 204. At the same time, Ag particles 207 tend to form a Si—Ag-M alloy, which in turn penetrates through the silicon nitride layer and subsequently forms a continuous metal contact.

Referring to FIG. 2C, as the Si—Ag-M alloy of FIG. 2B solidifies, conductive crystallites 214 tend to form in the silicon substrate, electrically coupling the front metal contact to the emitter 208 through the non-conductive glass layer 213. The formation of these crystallites is dependent on the properties of the surface and in particular the presence of phosphrous containing silicon particle layer 212. The authors believe that by including a layer of phosphorous containing silicon particles in the contact region it is possible to enhance the formation of these crystallites, creating more crystals and resulting in lower contact resistance. The presence of the phosphorous containing silicon particle layer enhances the formation of crystallites at the interface between the metal and the silicon.

In general, the sheet resistance required for the good contact formation using a standard front silver paste is about 60 Ohm/sq or less, in part dictated by the requirement for a high phosphorous surface concentration. With the addition of a silicon particle film, the inventors believe it is possible to form good ohmic contact to emitters with higher sheet resistance (>60 Ohm/sq) thus enabling higher solar cell efficiency due to reduced recombination in the emitter. The described approach is advantageous for a number of reasons: (a) low resistance contacts may be formed on lightly doped emitters without a need to form a heavy diffusion in the contact regions, which simplifies diffusion process; (b) ink printing takes place after the high temperature diffusion step which tends to reduce the potential for contamination from the additional substrate handling associated with the printing and drying steps; and, (c) printed ink lines may provide highly visible pattern for metal pattern alignment ensuring robustness of the process.

Experiment 1

Figure 3A:
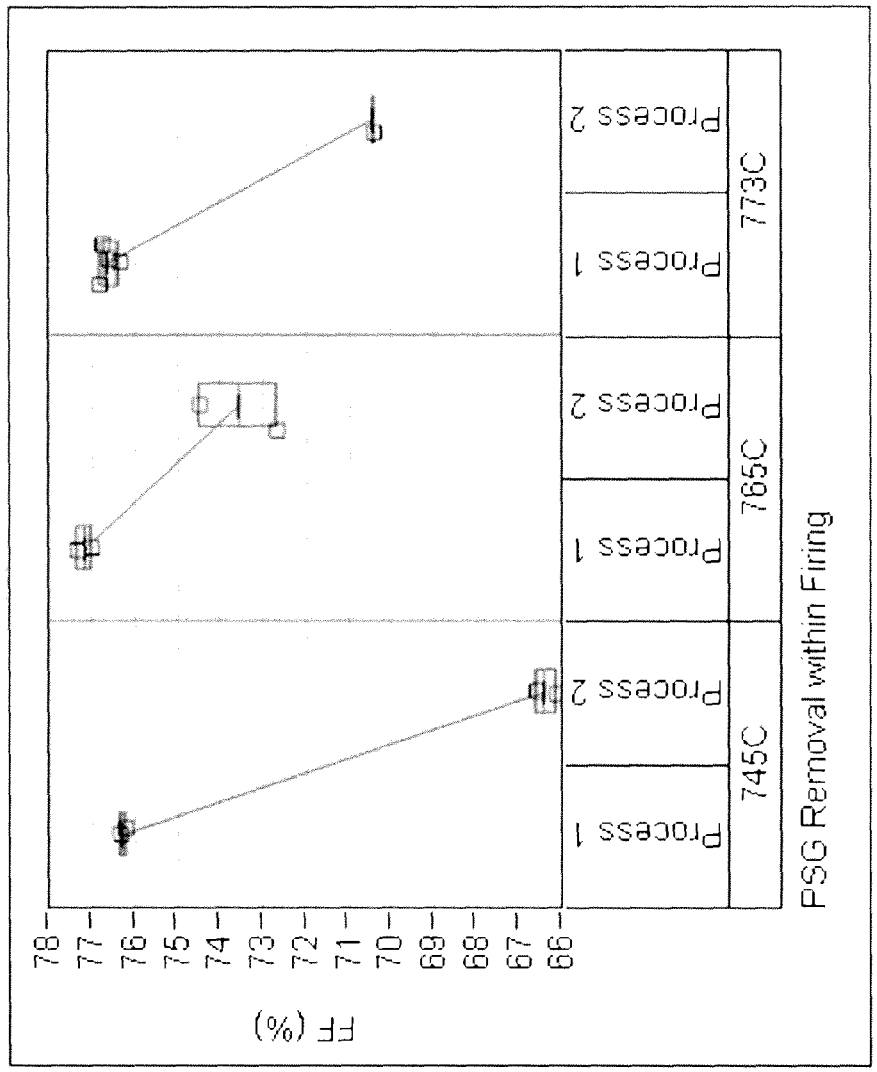
FIGS. 3A-C show the fill factor (FF), series resistance and efficiency for two sets of substrates processed at three different contact firing temperature and time conditions, and with two different PSG removal procedures, in accordance with the invention.
Figure 3B:
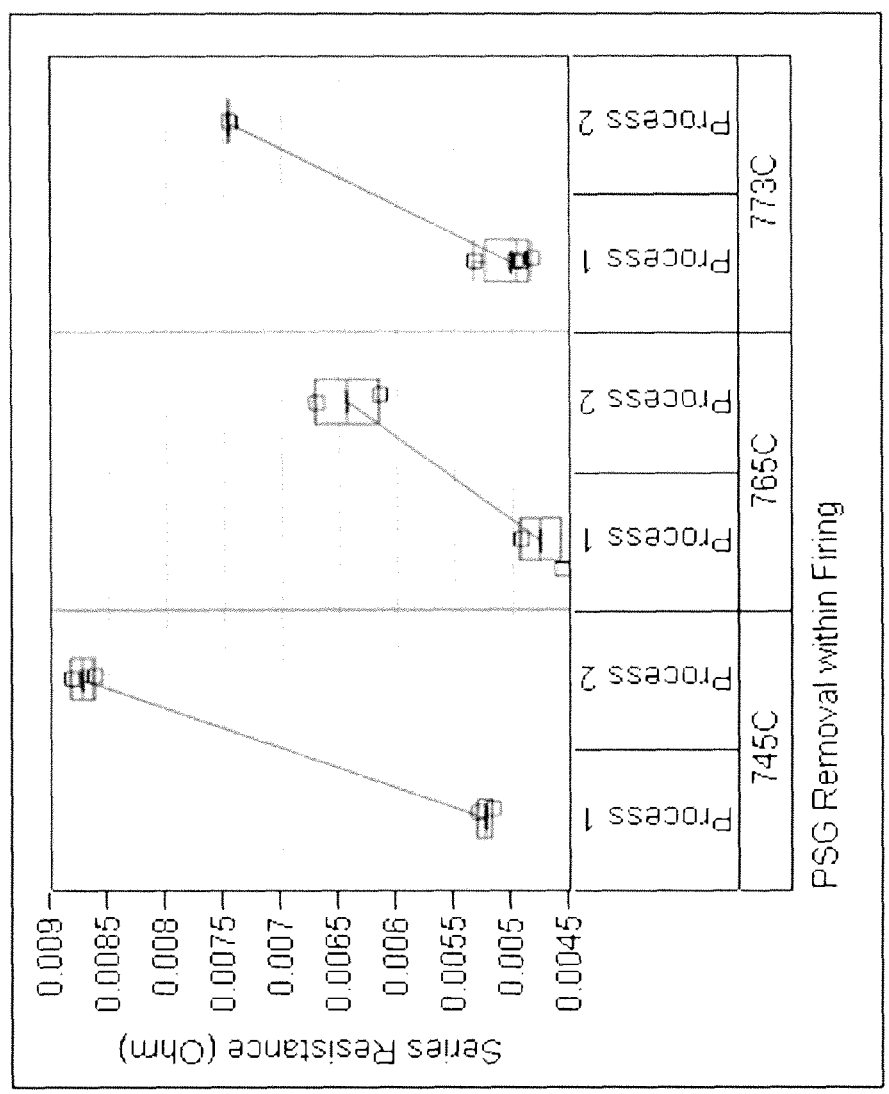
Figure 3C:
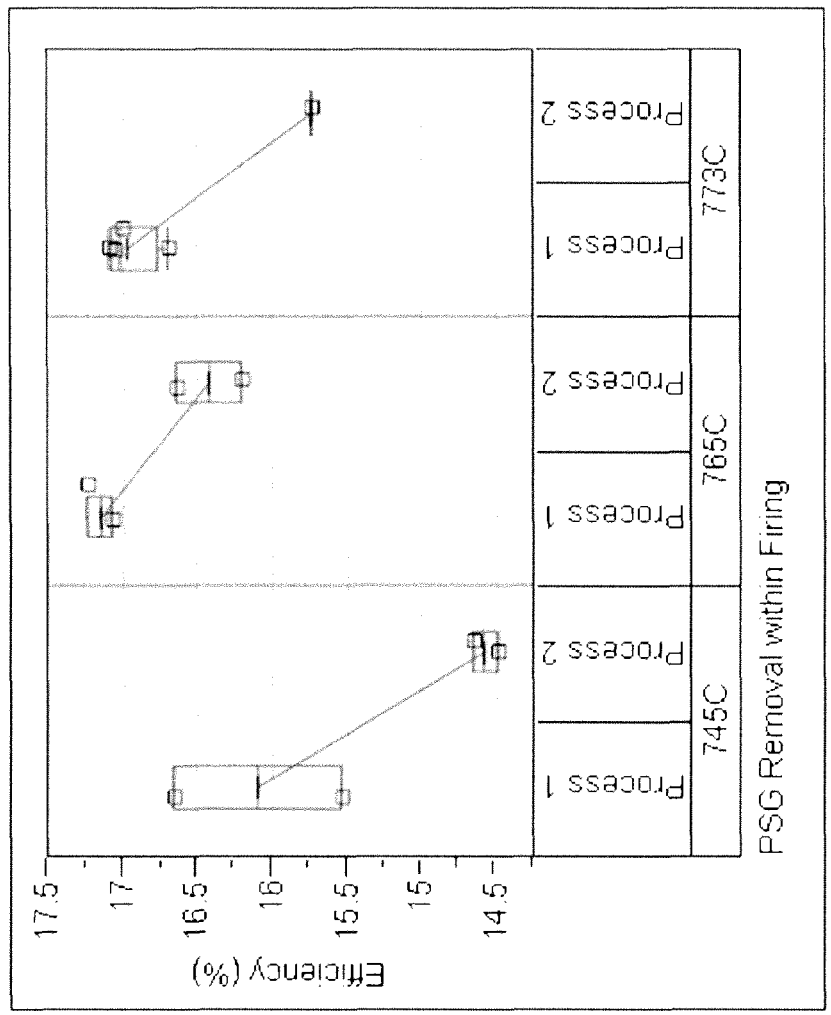

Referring now to FIGS. 3A-C, the fill factor (FF), series resistance and efficiency are shown for two sets of substrates processed at three different contact firing temperature and time conditions, and with two different PSG removal procedures in accordance with the invention. For the sets of substrates, FIG. 3A compares the FF (fill factor), FIG. 3B compares series resistance, and FIG. 3C compares efficiency.

In an advantageous manner, the ability of a silicon particle layer to enhance the formation of contacts was demonstrated experimentally by examining the contact formation in solar cells with different particle layers present during contact formation. In general, FF, series resistance and efficiency are an indication of the quality of the contact formation.

FF (fill factor) is defined as the ratio of the maximum power from the solar cell to the product of $V_{oc}$ (open circuit voltage) and $I_{sc}$ (short circuit current). Series resistance represents the ohmic resistance to current flow and is composed of resistance from the substrate (including the emitter), between the substrate and a metal contact, and across the metal contact. Efficiency is the ratio of the electrical power delivered at an operating point to the incident light power.

In this experiment, all substrate sets were comprised of saw-damage etched p-type silicon substrate, each with a thickness of about 180 um and a bulk resistivity of about 2 Ohm-cm. The substrates were first cleaned with piranha (a mixture of sulfuric acid ($H_2SO_4$) and hydrogen peroxide ($H_2O_2$)). This cleaning was followed by a DI water rinsing step and then a subsequent buffered oxide etch (BOE) dip followed by a final DI water rinse. Substrates were then dried using $N_2$ prior to deposition of a silicon nanoparticle fluid on one side of the substrate (with the nanoparticle fluid comprising about 4 at % (atomic percent) silicon nanoparticles in a set of organic solvents).

The substrate was then baked at a temperature of 600° C. in a baking ambient in a rapid thermal processing (RTP) tool for a time period of about 3 minutes in order to evaporate solvent molecules and to form a densified film.

In a first process (Process 1) a first subset of substrates, were exposed to a dopant source in a diffusion furnace with a deposition ambient of $POCl_3$, $N_2$, and $O_2$, at a deposition temperature of about 800° C., and for deposition time period of about 20 minutes, followed by an additional oxidation step for about 10 min at the same temperature, followed by additional drive-in thermal step in a drive-in ambient at a drive in temperature of about 900° C. for a drive in time period of about 30 minutes. The residual PSG glass layers on the substrate surface and the densified film surface were subsequently removed by being dipped in a buffered oxide etchant (BOE) for about 5 minutes.

In a second process (Process 2), a second subset of substrates were processed as the first set of substrates with the addition of an additional clean for 5 minutes in $H_2SO_4$:$H_2O_2$ (2:1) and an additional 5 minutes in BOE in order to remove additional phosphorus doped particles while leaving the underlying sheet resistance unchanged. The cells were screen-printed with conventional silver paste on the front side, Al—Ag rear side busbars and Al paste over the rear surface to form a BSF. After metal printing the cells were fired to peak temperatures of about 745° C., 765° C., and 773° C. with a temperature profile such that the time above 700° C. (firing time period) was around 4 seconds.

As can be seen, substrates processed with Process 1 which had a much more substantial silicon particle film remaining after PSG removal yield substantially beneficial fill factors in excess of 77% and corresponding low series resistance. The cells fabricated with the additional Piranha/BOE cleaning (Process 2) showed strongly reduced fill factor, resulting from increased series resistance. The cells from these two conditions were subsequently etched in a dilute HF solution to remove Ag contacts and expose the contact regions. Subsequent SEM imaging revealed a substantially reduced number of Ag crystallites for the Process 2 as compared to Process 1. Consequently, the inventors believe that modifying the surface of wafer with silicon particle film (without modifying doping profile) strongly affects contact formation.

Figure 4A:
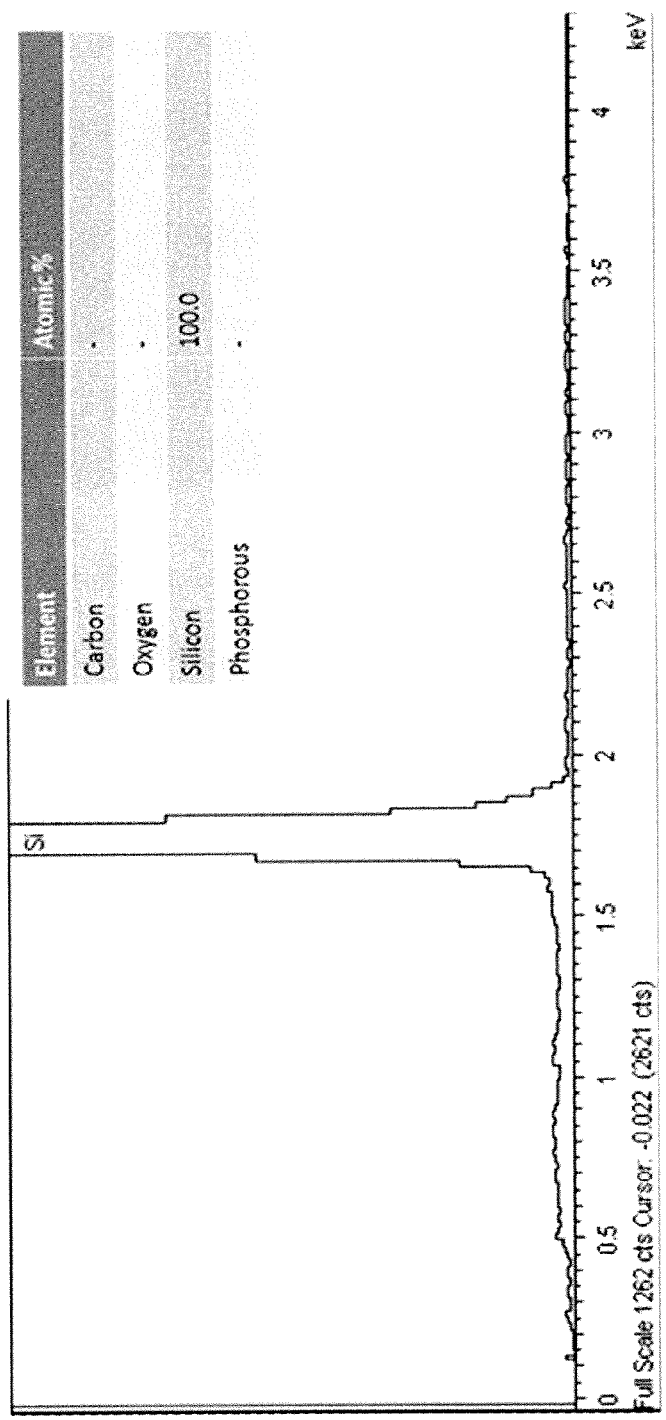
FIGS. 4A-B show Energy-Dispersive X-ray spectroscopy (EDX) measurements on both a silicon wafer surface and a silicon particle film, in accordance with the invention.
Figure 4B:
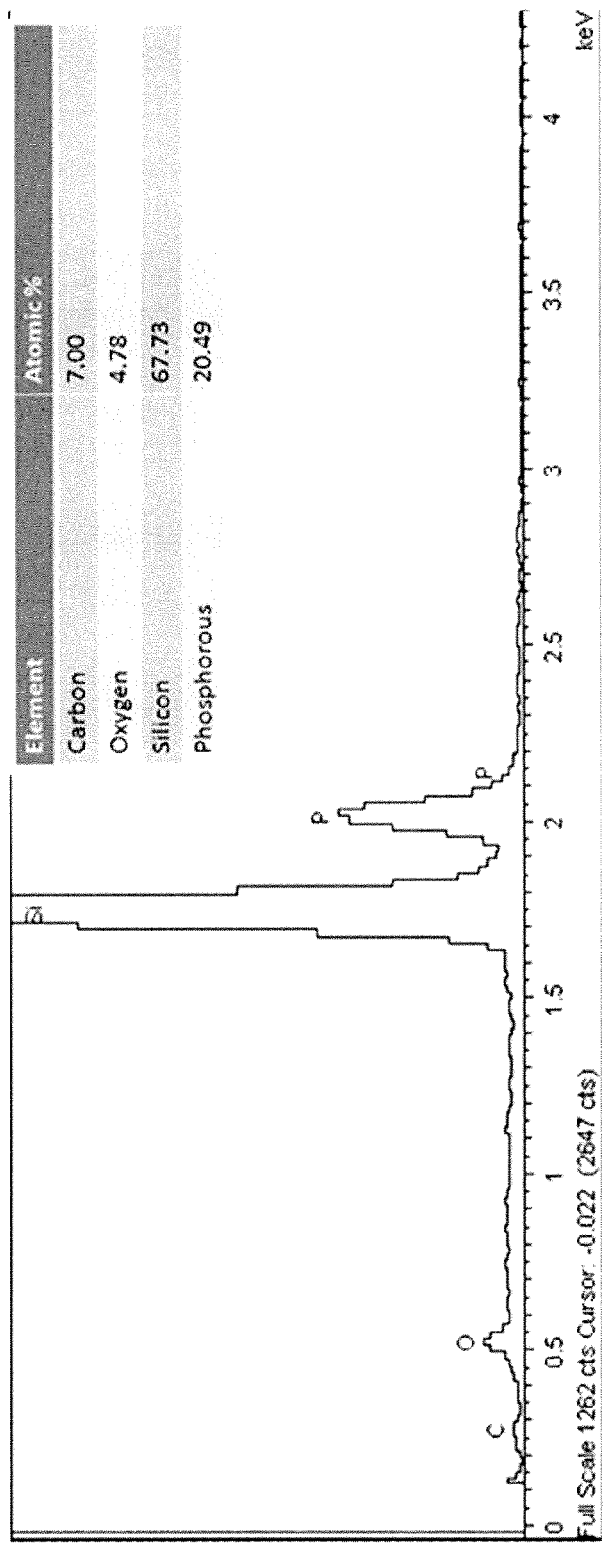

Referring now to FIGS. 4A-B, Energy-Dispersive X-ray spectroscopy (EDX) spectra are shown as measured on both a high efficiency emitter (FIG. 4A) and a silicon particle film (FIG. 4B), in accordance with the invention.

In this experiment, all substrate sets were comprised of saw-damage etched p-type silicon substrate, each with a thickness of about 180 um and a bulk resistivity of about 2 Ohm-cm. The substrates were first cleaned with piranha (a mixture of sulfuric acid ($H_2SO_4$) and hydrogen peroxide ($H_2O_2$)). This cleaning was followed by a DI water rinsing step and then a subsequent buffered oxide etch (BOE) dip followed by a final DI water rinse. Substrates were then dried using $N_2$ prior to deposition of a silicon nanoparticle fluid on one side of the substrate.

The substrate was then baked at a temperature of 200° C. for about 10 min in a nitrogen ambient inside a quartz tube furnace in order to evaporate solvent molecules and to form a densified film.

Subsequently the substrates were cleaned in a dilute aqueous solution of hydrofluoric (HF) acid and hydrochloric (HCl) acid. After cleaning the wafer were loaded in a diffusion tube furnace where the substrates were exposed to a dopant source with a deposition ambient of $POCl_3$, $N_2$, and $O_2$, at a deposition temperature of about 800° C., and for deposition time period of about 20 minutes, followed by an additional oxidation step for about 10 min at the same temperature, followed by the drive-in thermal step in a nitrogen ambient at a drive in temperature of about 900° C. for a drive in time period of about 25 minutes. The residual PSG glass layers on the substrate surface and the densified film surface were subsequently removed by being dipping the substrates in a buffered oxide etchant (BOE) for about 5 minutes.

The EDX measurements clearly show that significant amounts of phosphorous are present at the surface in the silicon particle layer, over 20 at % as seen in FIG. 4B, as opposed to the high efficiency emitter, see FIG. 4A. Again, in agreement with the earlier arguments, the presence of such a significant amount of phosphorous atoms near the surface of the emitter is believed to be beneficial to contact formation during the contact fire-through process.

Figure 5:
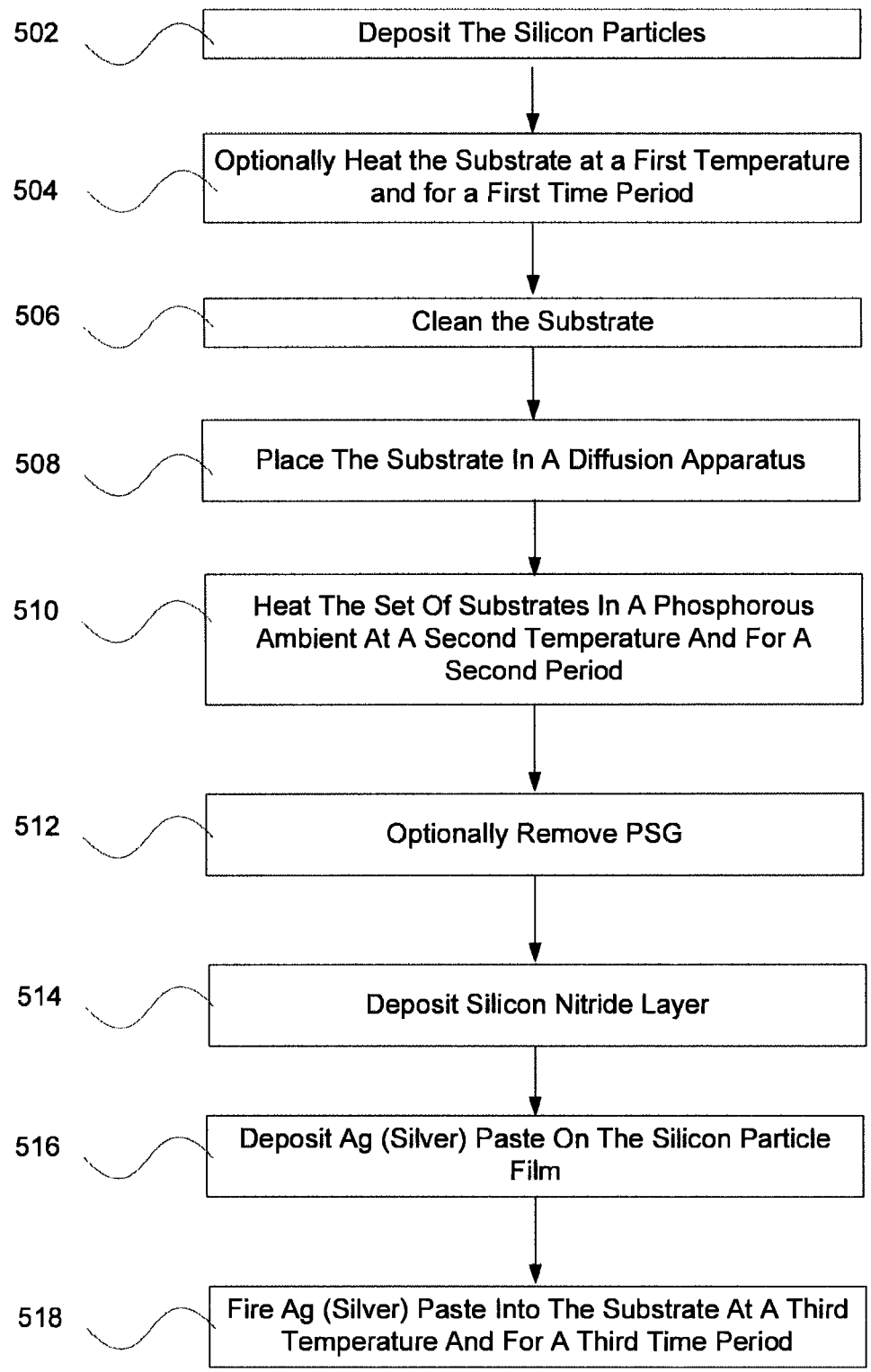
FIG. 5 shows a simplified method of forming a low resistance silicon metal contact in which the particles are deposited before the phosphorous diffusion, in accordance with the invention.

Referring now to FIG. 5, a simplified method of forming a low resistance silicon metal contact is shown in which the particles are deposited before the phosphorous diffusion, in accordance with the invention. In general, the silicon nanoparticles may be doped with phosphorous or undoped.

Initially at step 502, a silicon particle fluid is deposited on a first surface (front or rear) of each substrate in order to form a silicon particle film.

Optionally at step 504, the substrate is baked in order to remove the set of solvents from the silicon particle film and to further densify the deposited silicon particle film to a final thickness between about 100 nm to about 1000 nm. This may be done at a first temperature of between about 150° C. and about 600° C. and for a first time period of between about 30 seconds and about 10 minutes.

Optionally at step 506, each substrate is cleaned in a chemical bath to remove unwanted impurities and oxidized parts of the silicon film. Examples of chemicals used at this step include, but are not limited to, at least one of hydrofluoric acid (HF), buffered oxide etchant (BOE), mixture of hydrogen peroxide and sulfuric acid, mixture of hydrogen peroxide, ammonium hydroxide and water.

At step 508, the substrate is placed in a diffusion apparatus, such as a tube furnace or an inline furnace.

Next at step 510, the set of substrates is heated in a phosphorous ambient, such as $POCl_3$ in a tube furnace or $H_3PO_4$ in an inline furnace. For example, in a tube diffusion furnace configuration, the substrate is exposed to a dopant source in a diffusion furnace with a deposition ambient, the deposition ambient comprising $POCl_3$, a carrier $N_2$ gas, a main $N_2$ gas, and a reactive $O_2$ gas, wherein a ratio of the carrier $N_2$ gas to the reactive $O_2$ gas is between about 1:1 to about 1.5:1 wherein a PSG layer is formed on the substrate surface. Preferably, the tube diffusion temperature is between about 700° C. and about 1000° C., and the tube diffusion time period is about 5 minutes to about 35 minutes. More preferably, the tube diffusion temperature is between about 800° C. and about 900° C., and the tube diffusion time period is about 10 minutes to about 30 minutes. Most preferably, the tube diffusion temperature is between 800° C. and 850° C. and the diffusion time period is about 20 minutes. Optionally, the deposition step could be followed by an oxidation step and a drive-in step, which could also be performed at a higher temperature, between 800° C. and 1000° C.

Optionally at 512, the PSG deposited during the furnace diffusion is removed by placing the substrates in a chemical bath containing chemicals that will remove the glass layer. Examples of chemicals used at this step include, but are not limited to, at least one of hydrofluoric acid (HF) and buffered oxide etchant (BOE). Optionally, an edge isolation step (e.g. by dry plasma etching or wet etching) could be performed prior to the PSG removal step 512. At 514, the silicon nitride is deposited on the front surface of the substrate to reduce the front surface recombination and reduce the amount of reflection from the front side of the solar cell.

At step 516, an Ag (silver) paste is deposited on the silicon particle film.

Finally, at step 518, the Ag (silver) paste is fired into the substrate at a temperature preferably between about 700° C. and about 800° C., more preferably between about 750° C. and about 780° C., and most preferably about 765° C. During the firing the temperature should preferably be kept above 700° C. for between about 1 second and about 5 seconds, more preferably between about 3 seconds and about 4 seconds, and more preferably for about 4 seconds.

Figure 6:
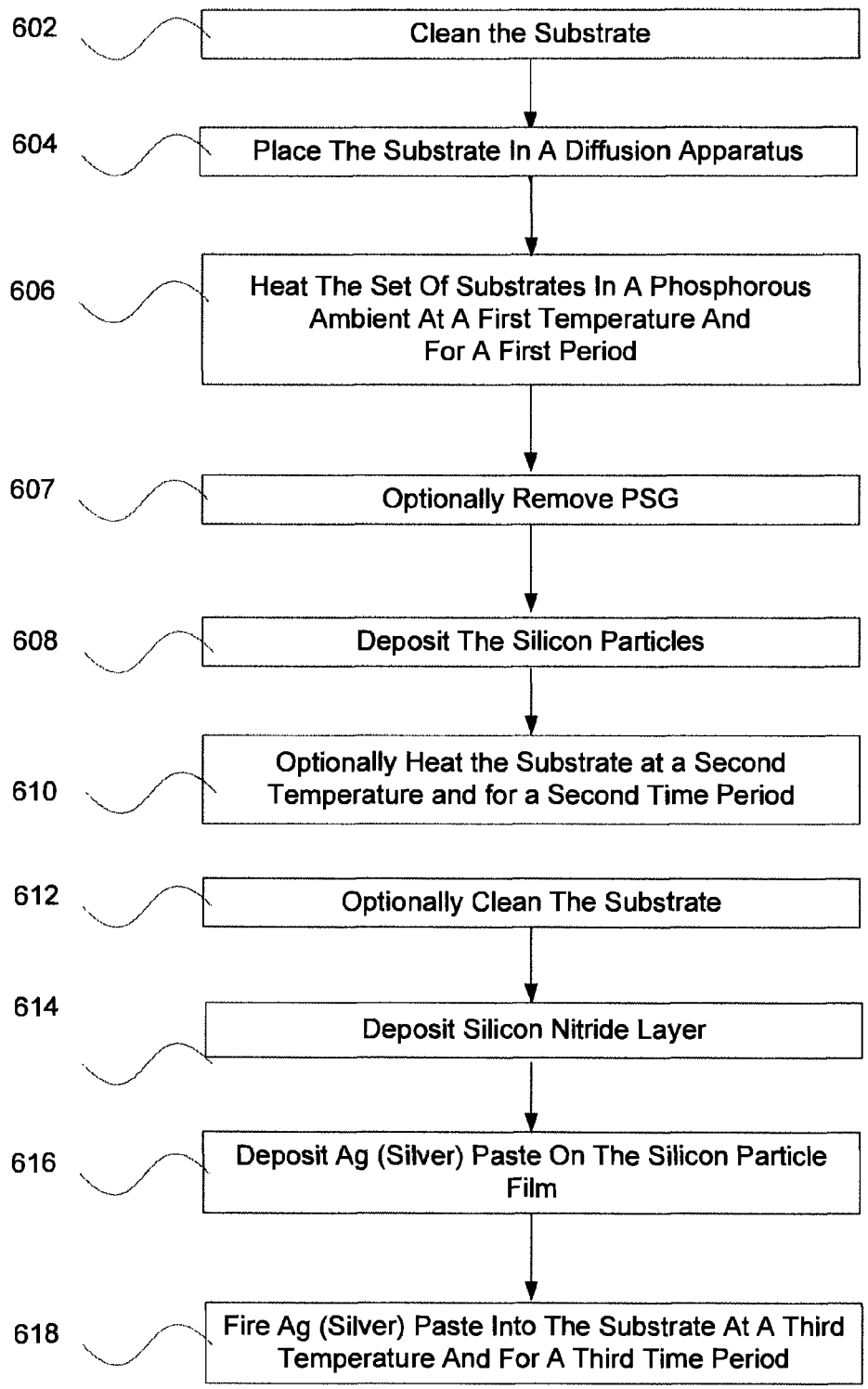
FIG. 6 shows a simplified method of forming a low resistance silicon metal contact is shown in which silicon particles are deposited after the phosphorous diffusion, in accordance with the invention; and, FIG. 7 shows a method of forming a low resistance silicon metal contact in which silicon particles are deposited after the nitride deposition, in accordance with the invention.

Referring now to FIG. 6, a simplified method of forming a low resistance silicon metal contact is shown in which silicon particles are deposited after the phosphorous diffusion, in accordance with the invention.

At step 602, each substrate is cleaned in a chemical bath to remove unwanted impurities and an oxide layer that may be present on the surface of the substrate. Examples of chemicals used at this step include, but are not limited to, at least one of hydrofluoric acid (HF), buffered oxide etchant (BOE), mixture of hydrogen peroxide and sulfuric acid, mixture of hydrogen peroxide, ammonium hydroxide and water.

At step 604, the substrate is placed in a diffusion apparatus, such as a tube furnace or an inline furnace.

Next at step 606, the set of substrates is heated in a phosphorous ambient, such as $POCl_3$ in a tube furnace or $H_3PO_4$ in an inline furnace. For example, in a tube diffusion furnace configuration, the substrate is exposed to a dopant source in a diffusion furnace with a deposition ambient, the deposition ambient comprising $POCl_3$, a carrier $N_2$ gas, a main $N_2$ gas, and a reactive $O_2$ gas, wherein a ratio of the carrier $N_2$ gas to the reactive $O_2$ gas is between about 1:1 to about 1.5:1 wherein a PSG layer is formed on the substrate surface. Preferably, the tube diffusion temperature is between about 700° C. and about 1000° C., and the tube diffusion time period is about 5 minutes to about 35 minutes. More preferably, the tube diffusion temperature is between about 800° C. and about 900° C., and the tube diffusion time period is about 10 minutes to about 30 minutes. Most preferably, the tube diffusion temperature is between 800° C. and 850° C. and the diffusion time period is about 20 minutes. Optionally, the deposition step could be followed by an oxidation step and a drive-in step, which could also be performed at a higher temperature, between 800° C. and 1000° C.

Optionally at 607, the PSG deposited during the furnace diffusion is removed by placing the substrates in a chemical bath containing chemicals that will remove the glass layer. Examples of chemicals used at this step include, but are not limited to, at least one of hydrofluoric acid (HF) and buffered oxide etchant (BOE). Optionally, an edge isolation step (e.g. by dry plasma etching or wet etching) could be performed prior to the PSG removal step 607.

At step 608, a silicon particle fluid is deposited on a first surface (front or rear) of each substrate in order to form a silicon particle film. In one configuration, the phosphorous concentration is greater than 1 at %.

At step 610, the substrate is baked in order to remove the set of solvents from the silicon particle film and to further densify the deposited silicon particle film to a final thickness from about 100 nm to about 1000 nm. This may be done in a first temperature of between about 150° C. and about 600° C. and for a first time period of between about 30 seconds and about 10 minutes.

Optionally at step 612, each substrate is cleaned in a chemical bath to remove unwanted impurities and oxidized parts of the silicon film. Examples of chemicals used at this step include, but are not limited to, at least one of hydrofluoric acid (HF), buffered oxide etchant (BOE), mixture of hydrogen peroxide and sulfuric acid, mixture of hydrogen peroxide, ammonium hydroxide and water.

At 614, the silicon nitride is deposited on the front surface of the substrate to reduce the front surface recombination and reduce the amount of reflection from the front side of the solar cell. At step 616, an Ag (silver) paste is deposited on the silicon particle film.

Finally, at step 618, the Ag (silver) paste is fired into the substrate at a temperature preferably between about 700° C. and about 800° C., more preferably between about 750° C. and about 780° C., and most preferably about 765° C. During the firing the temperature should preferably be kept above 700° C. for between about 1 second and about 5 seconds, more preferably between about 3 seconds and about 4 seconds, and more preferably for about 4 seconds.

Figure 7:
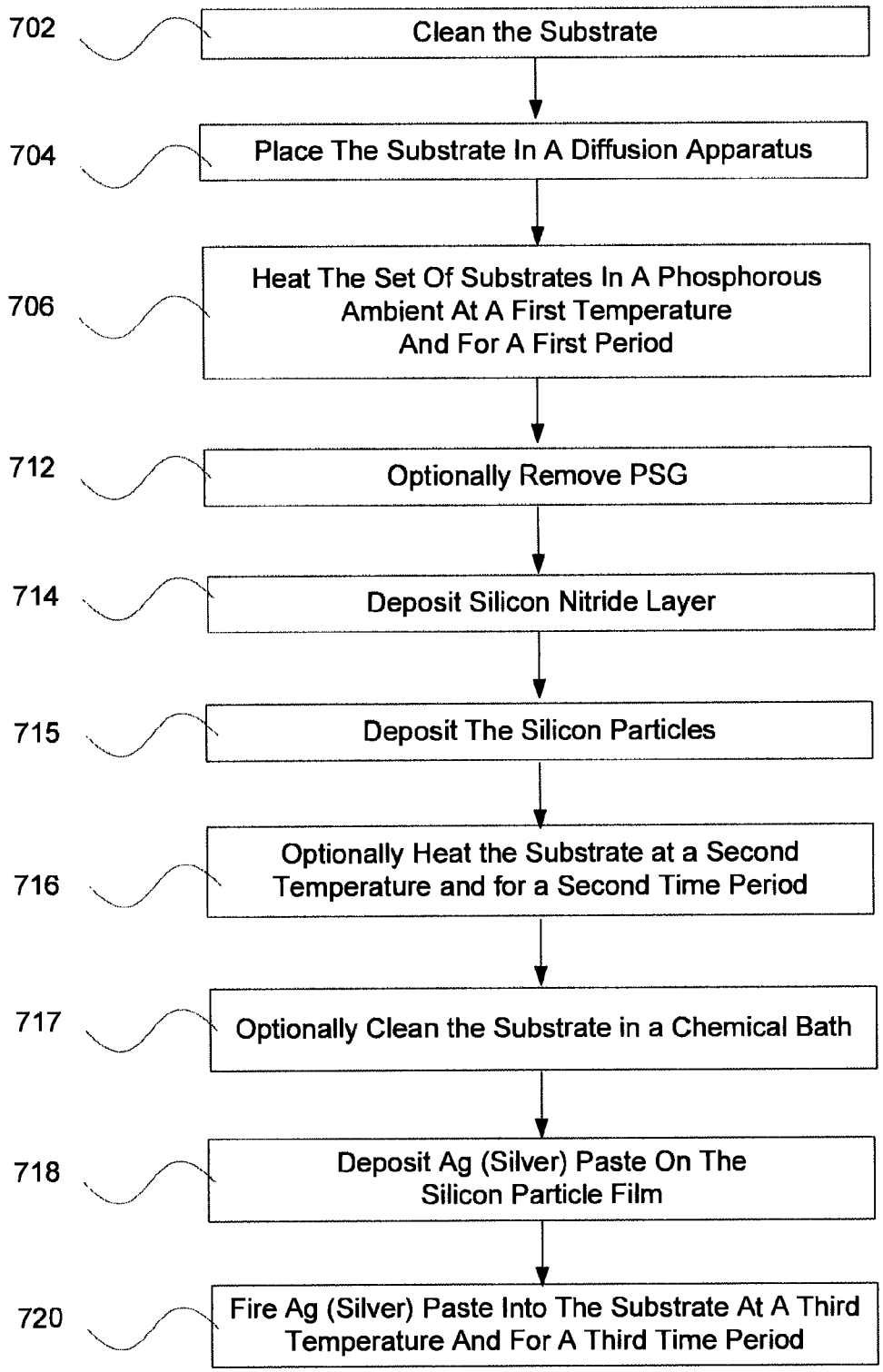

Referring now to FIG. 7, a method of forming a low resistance silicon metal contact is shown in which silicon particles are deposited after the nitride deposition, in accordance with the invention.

At step 702, each substrate is cleaned in a chemical bath to remove unwanted impurities and an oxide layer that may be present on the surface of the substrate. Examples of chemicals used at this step include, but are not limited to, at least one of hydrofluoric acid (HF), buffered oxide etchant (BOE), mixture of hydrogen peroxide and sulfuric acid, mixture of hydrogen peroxide, ammonium hydroxide and water. At step 704, the substrate is placed in a diffusion apparatus, such as a tube furnace or an inline furnace.

Next at step 706, the set of substrates is heated in a phosphorous ambient, such as $POCl_3$ in a tube furnace or $H_3PO_4$ in an inline furnace. For example, in a tube diffusion furnace configuration, the substrate is exposed to a dopant source in a diffusion furnace with a deposition ambient, the deposition ambient comprising $POCl_3$, a carrier $N_2$ gas, a main $N_2$ gas, and a reactive $O_2$ gas, wherein a ratio of the carrier $N_2$ gas to the reactive $O_2$ gas is between about 1:1 to about 1.5:1 wherein a PSG layer is formed on the substrate surface. Preferably, the tube diffusion temperature is between about 700° C. and about 1000° C., and the tube diffusion time period is about 5 minutes to about 35 minutes. More preferably, the tube diffusion temperature is between about 800° C. and about 900° C., and the tube diffusion time period is about 10 minutes to about 30 minutes. Most preferably, the tube diffusion temperature is between 800° C. and 850° C. and the diffusion time period is about 20 minutes. Optionally, the deposition step could be followed by an oxidation step and a drive-in step, which could also be performed at a higher temperature, between 800° C. and 1000° C.

Optionally at 712, the PSG deposited during the furnace diffusion is removed by placing the substrates in a chemical bath containing chemicals that will remove the glass layer. Examples of chemicals used at this step include, but are not limited to, at least one of hydrofluoric acid (HF) and buffered oxide etchant (BOE). Optionally, an edge isolation step (e.g. by dry plasma etching or wet etching) could be performed prior to the PSG removal step 712.

At 714, the silicon nitride is deposited on the front surface of the substrate to reduce the front surface recombination and reduce the amount of reflection from the front side of the solar cell. At step 715, a silicon particle fluid is deposited on a first surface (front or rear) of each substrate in order to form a silicon particle film. In one configuration, the phosphorous concentration is greater than 1 at %.

At step 716, the substrate is baked in order to remove the set of solvents from the silicon particle film and to further densify the deposited silicon particle film to a thickness from about 100 nm to about 1000 nm. This may be done in a first temperature of between about 150° C. and about 600° C. and for a first time period of between about 30 seconds and about 10 minutes.

Optionally at step 717, each substrate is cleaned in a chemical bath to remove unwanted impurities and oxidized parts of the silicon film. Examples of chemicals used at this step include, but are not limited to, at least one of hydrofluoric acid (HF), buffered oxide etchant (BOE), mixture of hydrogen peroxide and sulfuric acid, mixture of hydrogen peroxide, ammonium hydroxide and water.

At step 718, an Ag (silver) paste is deposited on the silicon particle film.

Finally, at step 720, the Ag (silver) paste is fired into the substrate at a temperature preferably between about 700° C. and about 800° C., more preferably between about 750° C. and about 780° C., and most preferably about 765° C. During the firing the temperature should preferably be kept above 700° C. for between about 1 second and about 5 seconds, more preferably between about 3 seconds and about 4 seconds, and more preferably for about 4 seconds.

The inventions illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed.

Thus, it should be understood that although the present invention has been specifically disclosed by preferred embodiments and optional features, modification, improvement and variation of the inventions herein disclosed may be resorted to by those skilled in the art, and that such modifications, improvements and variations are considered to be within the scope of this invention. The materials, methods, and examples provided here are representative of preferred embodiments, are exemplary, and are not intended as limitations on the scope of the invention.

As will be understood by one skilled in the art, for any and all purposes, particularly in terms of providing a written description, all ranges disclosed herein also encompass any and all possible sub-ranges and combinations of sub-ranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into sub-ranges as discussed above. In addition, the terms "dopant or doped" and "counter-dopant or counter-doped" refer to a set of dopants of opposite types. That is, if the dopant is p-type, then the counter-dopant is n-type. Furthermore, unless otherwise dopant-types may be switched. In addition, the term "substrate" may include both mono-crystalline and multi-crystalline substrates.

All publications, patent applications, issued patents, and other documents referred to in this specification are herein incorporated by reference as if each individual publication, patent application, issued patent, or other document were specifically and individually indicated to be incorporated by reference in its entirety. Definitions that are contained in text incorporated by reference are excluded to the extent that they contradict definitions in this disclosure.

For the purposes of this disclosure and unless otherwise specified, "a" or "an" means "one or more." All patents, applications, references and publications cited herein are incorporated by reference in their entirety to the same extent as if they were individually incorporated by reference. In addition, the word set refers to a collection of one or more items or objects.

Advantages of the invention include methods of forming a low resistance silicon metal contact. Additional advantages include the production of efficient solar cells.

Having disclosed exemplary embodiments and the best mode, modifications and variations may be made to the disclosed embodiments while remaining within the subject and spirit of the invention as defined by the following claims.

What is claimed is:

1. A method of forming an ohmic contact on a substrate, comprising:

depositing a set of silicon particles on the substrate surface, wherein the set of silicon particles comprises one of phosphorous-doped silicon particles and intrinsic silicon particles;

heating the substrate in a baking ambient to a baking temperature and for a baking time period in order to create a densified film ink pattern;

exposing the substrate to a dopant source in a diffusion furnace with a deposition ambient, the deposition ambient comprising $POCl_3$, a carrier $N_2$ gas, a main $N_2$ gas, and a reactive $O_2$ gas at a deposition temperature and for a deposition time period, wherein a PSG layer is formed on the substrate surface;

heating the substrate in a drive-in ambient to a drive-in temperature and for a drive-in time period;

depositing a silicon nitride layer;

depositing a set of metal contacts on the set of silicon particles;

heating the substrate to a firing temperature and for a firing time period.

2. The method of claim 1, wherein the baking temperature is between about 150° C. and about 600° C. and the baking time period is between about 30 seconds and about 10 minutes.

3. The method of claim 1, wherein a ratio of the carrier $N_2$ gas to the reactive $O_2$ gas is between about 1:1 to about 1.5:1, the deposition temperature is between about 725° C. and about 875° C., and the deposition time period of about 5 minutes and about 35 minutes.

4. The method of claim 1, wherein the drive-in temperature is between about 800° C. and about 1000° C.

5. The method of claim 1, wherein the baking temperature is between about 200° C. and about 400° C. and the baking time period is between about 30 seconds and about 2 minutes.

6. The method of claim 1, wherein the deposition temperature is between about 750° C. and about 850° C., and the deposition time period is between about 10 minutes and about 30 minutes.

7. The method of claim 1, wherein the drive-in temperature is between about 850° C. and about 1000° C.

8. The method of claim 1, wherein the drive-in temperature is between about 850° C. and about 900° C.

9. The method of claim 1, wherein the drive-in time period is between about 15 minutes and about 40 minutes.

10. The method of claim 1, wherein the maximum firing temperature is between about 700° C. and about 800° C. and the firing time period is between about 1 second and about 5 seconds.

11. The method of claim 1, wherein the firing temperature is between about 750° C. and about 780° C. and the firing time period is between about 3 seconds and about 4 seconds.

12. The method of claim 1, wherein the PSG is removed after heating the substrate in a drive-in ambient to a drive-in temperature and for a drive-in time period.

13. The method of claim 1, wherein the substrate is cleaned after heating the substrate in a baking ambient to a baking temperature and for a baking time period.

14. A method of forming an ohmic contact on a substrate, comprising:

(A) exposing the substrate to a dopant source in a diffusion furnace with a deposition ambient, the deposition ambient comprising $POCl_3$, a carrier $N_2$ gas, a main $N_2$ gas, and a reactive $O_2$ gas at a deposition temperature and for a deposition time period, wherein a PSG layer is formed on the substrate surface;

(B) heating the substrate following said exposing (A) in a drive-in ambient to a drive-in temperature and for a drive-in time period;

(C) depositing a set of silicon particles on the substrate surface following said heating (B);

(D) heating the substrate following said depositing (C) in a baking ambient to a baking temperature and for a baking time period in order to create a densified film ink pattern;

(E) depositing silicon nitride layer following said heating (D);

(F) depositing a set of metal contacts on the set of silicon particles following said depositing (E); and (G) heating the substrate to a firing temperature and for a firing time period following said depositing (F).

15. The method of 14, wherein the set of silicon particles includes greater than 1 at % phosphorous.

16. The method of claim 14, wherein the baking temperature is between about 150° C. and about 600° C., and the baking time period is between about 30 seconds and about 10 minutes.

17. The method of claim 14, wherein the baking temperature is between about 200° C. and about 400° C. and the baking time period is between about 30 seconds and about 2 minutes.

18. The method of claim 14, wherein the PSG is removed after heating the substrate in a drive-in ambient to a drive-in temperature and for a drive-in time period.

19. The method of claim 14, wherein the substrate is cleaned after heating the substrate in a baking ambient to a baking temperature and for a baking time period.

20. A method of forming an ohmic contact on a substrate, comprising:

(A) exposing the substrate to a dopant source in a diffusion furnace with a deposition ambient, the deposition ambient comprising $POCl_3$, a carrier $N_2$ gas, a main $N_2$ gas, and a reactive $O_2$ gas at a deposition temperature and for a deposition time period, wherein a PSG layer is formed on the substrate surface;

(B) heating the substrate following said exposing (A) in a drive-in ambient to a drive-in temperature and for a drive-in time period;

(C) depositing silicon nitride layer following said heating (A);

(D) depositing a set of silicon particles on the substrate surface following said depositing (C);

(E) heating the substrate following said depositing (D) in a baking ambient to a baking temperature and for a baking time period in order to create a densified film ink pattern;

(F) depositing a set of metal contacts on the set of silicon particles following said heating (E); and (G) heating the substrate to a firing temperature and for a firing time period following said depositing (F).

21. The method of 20, wherein the set of silicon particles includes greater than 1 at % phosphorous.

22. The method of claim 20, wherein the baking temperature is between about 150° C. and about 600° C. and the baking time period is between about 30 seconds and about 10 minutes.

23. The method of claim 20, wherein the baking temperature is between about 200° C. and about 400° C. and the baking time period is between about 30 seconds and about 2 minutes.

24. The method of claim 20, wherein the substrate is cleaned after heating the substrate in a baking ambient to a baking temperature and for a baking time period.

* * * * *